(12) United States Patent
Chakraborty et al.

(10) Patent No.: US 9,294,061 B2
(45) Date of Patent: *Mar. 22, 2016

(54) LOW POWER, LOW OUT-OF-BAND HARMONIC CONTENT RADIO

(71) Applicant: Texas Instruments Incorporated, Dallas, TX (US)

(72) Inventors: Sudipto Chakraborty, Richardson, TX (US); David Le Deaut, Nuremberg (DE); Josef Einzinger, Georgensgmuend (DE); Jens Graul, Freising (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/869,643

(22) Filed: Sep. 29, 2015

(65) Prior Publication Data

US 2016/0020743 A1 Jan. 21, 2016

Related U.S. Application Data

(63) Continuation of application No. 14/807,079, filed on Jul. 23, 2015, which is a continuation of application No. 13/798,675, filed on Mar. 13, 2013, now Pat. No. 9,130,636.

(51) Int. Cl.
*H01Q 11/12* (2006.01)
*H03G 3/30* (2006.01)
*H04B 1/04* (2006.01)

(52) U.S. Cl.
CPC .............. *H03G 3/3042* (2013.01); *H04B 1/04* (2013.01); *H04B 2001/0408* (2013.01)

(58) Field of Classification Search
CPC ........ H04B 1/525; H04B 7/2609; H04B 1/44; H04B 3/54; H04B 5/0037; H04B 15/00; H04B 1/40; H04B 1/48; H04B 2203/5483; H04B 2203/5491; H04B 17/10; H04B 1/005; H04B 1/0057; H04B 1/006; H04B 1/0067; H04B 1/1081; H04B 1/109
USPC ....................................... 455/127.3
See application file for complete search history.

(56) References Cited

U.S. PATENT DOCUMENTS

| | | | | |
|---|---|---|---|---|
| 8,149,050 B2* | 4/2012 | Cabanillas | ............ | H03F 1/0277 330/302 |
| 2005/0014466 A1* | 1/2005 | Park | ................. | H04B 1/405 455/20 |
| 2005/0206471 A1* | 9/2005 | Khorram | ................. | H03H 7/42 333/25 |
| 2013/0295870 A1* | 11/2013 | Zhuo | ...................... | H04B 1/005 455/326 |
| 2014/0273883 A1 | 9/2014 | Chakraborty et al. | | |

OTHER PUBLICATIONS

Prosecution History from U.S. Appl. No. 13/798,675, dated Sep. 25, 2014 to Jul. 15, 2015, 72 pp.
Prosecution History from U.S. Appl. No. 14/807,079, dated Jul. 23, 2015 to Aug. 27, 2015, 81 pp.

* cited by examiner

*Primary Examiner* — Ajibola Akinyemi
(74) *Attorney, Agent, or Firm* — Gregory J. Albin; Frank D. Cimino

(57) ABSTRACT

A radio that includes a transceiver to transmit and receive RF signals. The transceiver including a transmitter, a transformer, and a receiver, the transformer is coupled to and shared between the transmitter and the receiver. A resonator is formed by the combination of the transformer and capacitive elements of the transmitter and receiver.

17 Claims, 2 Drawing Sheets

LOW POWER, LOW OUT-OF-BAND HARMONIC CONTENT RADIO

CROSS-REFERENCE TO RELATED APPLICATION

This application is a continuation of U.S. patent application Ser. No. 14/807,079, filed Jul. 23, 2015, which is a continuation of U.S. patent application Ser. No. 13/798,675, filed Mar. 13, 2013, both of which are incorporated herein by reference in their entirety.

BACKGROUND

Small, low-power battery operated radios are desirable for many applications where remote sensing and communication is required. For example, wearable, medical monitoring devices, bridge diagnostic sensors, and remote sensor arrays in general. For these devices, size and low-power may help with their installation in inaccessible locations. As such, battery operation is a must and long operational life between battery changes or charges may be desirable. In the context of radios, external matching networks may increase their size and cost due to the number of components conventionally needed, e.g., 7 to 10 per radio. Conventional small radios may utilize multiple broadband stages, which are power hungry at high frequency due to the high capacitive loads. Thus, there is conventionally a trade-off between size and power performance.

Low-power communication devices for microcontrollers are highly desirable. Conventional communication devices tend to require 7 to 10 external components for frequency tuning, impedance transformation between antenna and the RFIC, and to be compliant with governmental requirements concerning RF communications. To reduce Silicon area, conventional implementations also tend to utilize multiple broadband stages to drive capacitive load at high frequency, leading to power hungry implementations. Cost and time to market may be other concerns of current microcontroller manufacturers. The high number of external components may increase both cost and time to market due to design constraints. Additionally, filtering out-of-band harmonics from the carrier signal is of concern as well.

SUMMARY

The problems noted above are solved in large part by a radio that includes a transceiver to transmit and receive RF signals. The transceiver including a transmitter, a transformer, and a receiver, the transformer is coupled to and shared between the transmitter and the receiver. A resonator is formed by the combination of the transformer and capacitive elements of the transmitter and receiver.

In another embodiment, the problem is solved by a low-power transceiver. The low-power transceiver including a transmitter to amplify a first RF signal for transmission. The transmitter including a first amplifier stage, a transformer, and a second amplifier stage, wherein the first amplifier stage is coupled to the second amplifier stage through the transformer. The low-power transceiver also including a receiver to receive a second RF signal. The receiver including an amplifier, the transformer, and a mixer, wherein the amplifier is coupled to the mixer through the transformer.

In yet another embodiment, the problem is solved by a wireless communication device. The wireless communication device including a transmitter and a receiver. The transmitter comprising a first amplifier stage to amplify an RF signal received from a voltage controlled oscillator (VCO), a second amplifier stage to generate gain for the RF signal, and a transformer coupled between the first amplifier stage and the second amplifier stage. The receiver comprising an amplifier to amplify a received RF signal and a mixer; the transformer coupled between the amplifier and the mixer.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
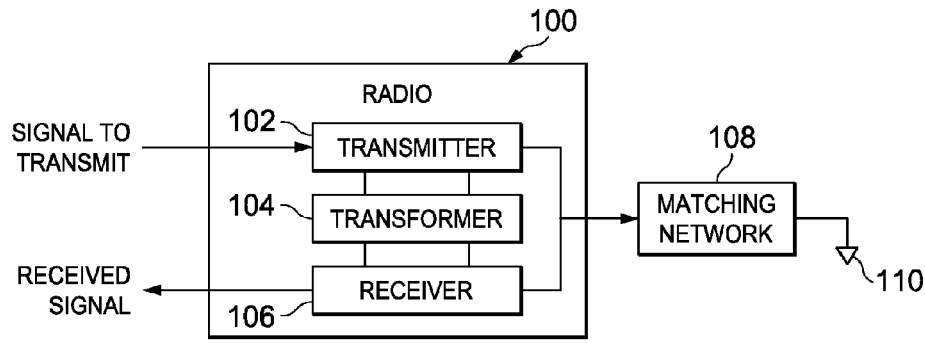
FIG. 1 shows an illustrative example of a radio in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

This disclosure is directed to a low-power, low out-of-band harmonic content radio, such as Bluetooth low energy and Bluetooth, preferably constructed on a single interconnected (IC) die, or chip, that may require minimum external components. The disclosed radio may be designed to operate at the fundamental RF frequency instead of a multiple or sub-multiple of the RF frequencies and may utilize an on-chip transformer. The transformers are beneficial in realizing low-power, low-voltage radio front end with fully linear differential to single-ended conversion. The on-chip transformer may be shared between the transceiver's transmitter and receiver. The placement of the on-chip transformer may be flexible and may be tailored to reduce potential electromagnetic coupling and frequency pulling issues for the transceiver. The placement of the transformer may also reduce the current consumption of the transceiver. Most of this disclosure may be geared toward a transceiver constructed on a single IC, but this disclosure is not limited in such a manner. The disclosure may be also implemented in radios constructed from discrete components.

Conventional radio architecture may operate voltage controlled oscillators (VCOs) at twice the radio frequency (RF) so to provide differential quadrature signals for receive path downcoversion at the receiver. This approach, however, may not be efficient in terms of current consumption for a transmitter where the modulation is applied either in phase or frequency. Due to the requirement of quadrature phases in the local oscillator (LO) signal path of the transceiver to satisfy the received down conversion requirement, the transmitter system of a conventional radio also includes the divider while signal processing is only necessary in the differential phase. This divider consumes significant amount of power at high frequency.

Alternatively, the disclosed low-power transceiver (radio) may use a phase locked loop (PLL) to synthesize time varying instantaneous frequencies using a delta-sigma modulator. As such, one differential phase may be sufficient for transmission and quadrature phase may not be necessary, thereby possibly eliminating a frequency divider that may be conventionally included in transceivers. In this implementation, the VCO may operate at the RF frequency of the radio and may drive three stages of transmit drivers, or power amplifier (PA) stages.

The current consumption of the transceiver may also be reduced through the implementation of the three PA stages in conjunction with other aspects of the disclosure. All three PA stages may be low current with one stage having a differential output and the other two stages having single-ended outputs. The interface between the VCO and the first PA stage and the interface between the first PA stage and the second PA stage may utilize narrowband resonating impedances from inductor/capacitor (L/C) tanks to reduce current consumption and enable flexible placement of the operative transceiver blocks to reduce broadband current consumption. The second PA stage may be broadband and AC coupled to the third PA stage. The third PA stage may be interfaced with a narrowband tuned matching network (usually out-of-chip) to perform voltage and current transformation to produce the desired output power.

Disclosed herein are systems and devices that may be used to create low-power, low out-of-band harmonic radios. The disclosed systems and devices include a transformer that may be shared between the transmitter and receiver of a transceiver. Including the transformer in the transceiver design and sharing it between the transmitter and receiver may allow for increased dynamic range per unit of current consumption. Additionally, the transformer may assist with filtering out harmonic content from a VCO along with supplying isolation between the VCO and the external matching network of the radio.

FIG. 1 shows an illustrative example of a radio 100 in accordance with various examples. The radio 100 may comprise a transmitter 102, a transformer 104, and a receiver 106. The radio 100 may be coupled to an external matching network (MN) 108, which may further be coupled to an antenna 110. The MN 108 may match the output impedance of the radio 100 to the impedance of the antenna 110 so that maximum power is delivered to the antenna 110. The transmitter 102 may amplify the transmission signal after a signal has been modulated and converted to the radio 100's radio frequency (RF) standard. The receiver 106 may be used to detect RF signals received by the radio 100. Further, the transformer 104 may be shared between the transmitter and receiver, and sharing the transformer may improve the harmonic performance and the current consumption of the transmitter 102 without adding any distortion to the transmitted signal. Additionally, the use of the transformer 104 by the transmitter 102 may also reduce the number of components used by the MN 108 to filter out harmonics. A reduction in the number of components used by the MN 108 may reduce radio development cycle-time and reduce the costs of production. The transformer 104 may be included in the radio 100 to allow for passive tuning of both the transmitter 102 and the receiver 106 while allowing for increased dynamic range per unit of current consumption.

The sharing of the transformer 104 between the transmitter 102 and the receiver 106 may produce several advantages over conventional radios. For one, since on-chip transformers tend to consume large areas of Silicon, sharing the transformer 104 may reduce the overall amount of Silicon real estate usage—as opposed to implementing separate transformers for the transmitter 102 and the receiver 106. However, the transmitter 102 and the receiver 106 may need to be time-division duplexed in their operation for the transformer 104 to be shared if the transmitter 102 and the receiver 106 are operating at the same frequency or their operational frequencies are very close. Alternatively, if the transmitter 102 and the receiver 106 are operating at different frequencies (but these frequencies are very close to each other), then the transformer 104 may be shared without the use of time-division multiplexing. If the transmitter 102 and the receiver 106 frequencies are somewhat further apart, separate tuning of the transformer 104 resonating interface may be necessary between transmit and receive modes. Other advantages provided by the transformer may include DC isolation between the primary and the secondary terminals of the transmitter 102, narrowband resonance used for interconnecting different stages of the radio 100, differential to single-ended conversion without any dynamic range degradation, and a flexible floor plan due to the presence of multiple inductive interfaces, which can tune out, or resonate out, high quality factor (Q-factor), long trace capacitances.

Figure 2:
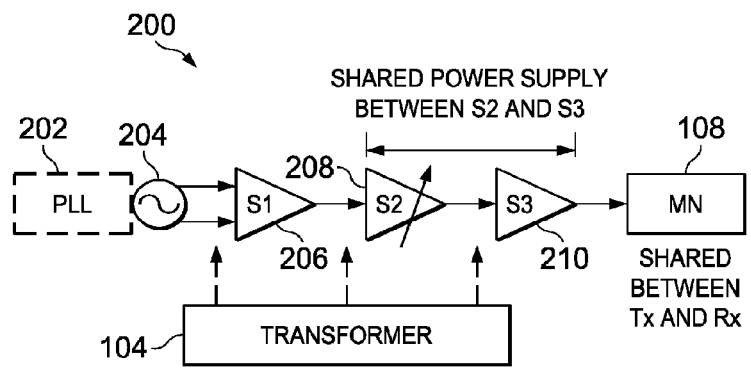
FIG. 2 shows an illustrative architecture for a transmitter in accordance with various examples.

FIG. 2 shows an illustrative architecture for a transmitter 200 to be implemented in a transceiver in accordance with various examples. The transmitter 200 may comprise a phase locked loop (PLL) 202, a voltage controlled oscillator (VCO) 204, a first power amplifier (PA) stage 206, a second PA stage 208, a third PA stage 210, and a transformer 104. The transformer 104 may be shared between the transmitter 200 and a receiver (not shown). Further, the transmitter 200 may couple to the MN 108, which may impedance match the transmitter 200 to an antenna, such as antenna 110.

For wireless standards employing phase/frequency modulation, a loop modulator architecture may be preferred where the modulation is implemented in the PLL 202 and the modulated signal is provided to the PA stages 206, 208, and 210. In the case of amplitude modulated systems, an in-phase and quadrature-phase (I/Q) mixer based approach may be implemented. Regardless of modulation type, sharing the transformer between transmitter and receiver may be used for both architectures as long as the transmitter and receiver operate one at a time, e.g., time division duplexed operation and frequency-division duplexed where transmit and receive frequencies are very close to one another. If the transmit and receive frequencies are somewhat further apart, separate tuning of the transformer 104's resonating interface may be necessary between transmit and receive modes.

The transformer 104 shared with the receiver may be located in several places, represented by the dashed lines, (inter-block impedance interface points) within the transmitter 200 architecture. In one implementation, the transformer 104 may be located between the VCO 204 and the PA 206. This implementation may result in all PA stages having single-ended outputs. However, the transmitter 200 may experience reduced tuning range when the transformer 104 is in this location due to the "off load" from the receiver possibly resulting in a fixed capacitance in the VCO 204's "tank." Yet, if the "off load" capacitance has a negligible effect on the tuning range, then placing the transformer 200 in this location may be a viable option in certain designs. A VCO tank may be referred to herein as a resonator tank that results from the combination of the VCO's inductor and the high capacitance of the interconnects between the VCO and transmitter/receiver blocks. A fixed capacitance may reduce the VCO 204's tuning range.

A second implementation may locate the transformer 104 between the PA 208 and the PA 210. This implementation may resonate out load from the PA 210 but may need to be optimized with the external MN 108 to ensure stability of the radio employing the transmitter in this architecture. A third implementation may locate the transformer 104 between the PA 206 and the PA 208. This third implementation may produce flexibility in regards to transceiver design and layout of a transceiver on a single chip.

Figure 3:
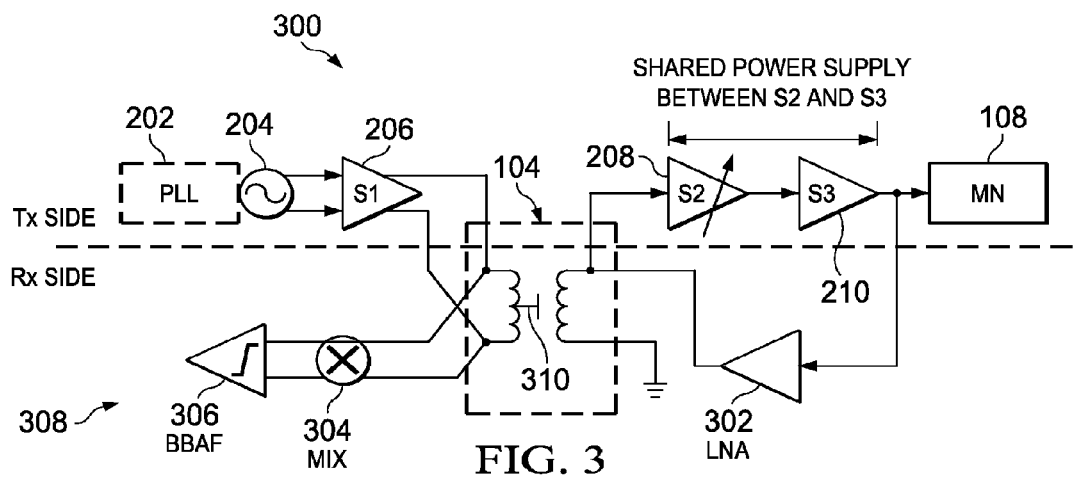
FIG. 3 shows an illustrative block diagram of a transceiver in accordance with various examples.

FIG. 3 shows an illustrative transceiver 300 in accordance with various examples. The transceiver 300 may comprise many, if not all, of the same components discussed in reference to the transmitter 200 with the additional pieces needed for a receiver 308—the receiver 308 of the transceiver 300 may comprise a low noise amplifier (LNA) 302, a mixer 304, and a base band analog filter (BBAF) 306. The transformer 104 may be shared between the transmitter 200 and the receiver 308. In the transmitter 200, the transformer may be coupled between the PA 206 and the PA 208 so that the transformer 104 converts the differential output of the PA 206 to a single-ended output to couple to the PA 208. In the receiver 308, the transformer 104 may be located between the LNA 302 and the mixer 304. Similarly, the transformer 104 may convert the single-ended output of the LNA 302 to differential outputs to couple to the mixer 304.

The first stage of the transmitter 200 may comprise the PA 206 and the transformer 104. The PA 206 may include doubly cascaded, current-reuse transconductors using NMOS and PMOS transistors for higher voltage gain, improved isolation and pulling effects. The first stage may provide isolation to the VCO 204 from the external matching MN 108 environment, and the capacitance reflected back to the VCO 204 as and when a gain step is exercised in the transmitter 200. The transformer 104 may also convert differential signals at the input to a single phase output at RF. The transformer 104 may further resonate with the capacitive load from the second stage, PA 208. Further, the first stage may use a resistive tail bias to obtain sufficient common mode rejection at RF at lowest possible headroom and area. This stage may be implemented by using MOS transistors operating in the linear region.

The second stage of the transmitter 200 may comprise the PA 208. The PA 206 may provide gain steps for the transmitter 200. Gain steps allow the transmitter 200 to alter the power delivered to the transmitted signal, which may be adjusted due to channel conditions. Gain steps may be achieved by digitally changing the degeneration resistors in both NMOS and PMOS transconductors of a self-biased class-AB amplifier. As this is self-biased, there may be no additional current consumption from the power management unit (PMU). The PA 206 may be broadband in nature and may be capacitively-coupled to the third and final driver stage, PA 210. The PA 206 may provide isolation between the narrowband inductive resonator present in the first and second stage interface, and the MN 108 interface of the last stage. The narrowband inductive resonator present in the first stage and the second stage interface may be the combination of the transformer and the long traces connecting the transformer to the PA 206 and 208.

The isolation between the narrowband inductive resonator and the MN 108 may remain nearly un-altered in the event of change in output power either by: (a) change in the gain step, or (b) a change in local low dropout regulator (LDO) supply voltage to obtain lower current consumption. The PA 208 may be powered down by the transceiver 300 and the power down signal may come from either the local LDO supply or the resistive degeneration resistors of the NMOS and PMOS transconductors.

The third stage, the PA 210, may also be a self-biased class-AB amplifier, which may be controlled by its supply voltage. The last two stages (PA 208, 210) may also be operated from the same supply rail. There may be no need of additional bias currents from the PMU, eliminating the need for additional routing within the IC of the transceiver, as well as supply noise. The PA 210 may provide a near-constant level of output impedance to the external MN 108 interface, so that the transmitter 200 gain step does not impact the level of impedance match. The PA 210 may also be powered down and the power down signal may come from the local LDO supply, as that provides the highest possible headroom.

The transformer 104 load in the first stage may help improve the harmonic performance of the transmitter 200 by providing significant filtering at second and third harmonics of the RF signal. The transformer 104 may also provide filtering to the rising out-of-band noise floor from sigma-delta modulator associated with the PLL 202. The differential to single-ended conversion may also happen at the transformer 104 interface. Utilizing the transformer 104 to convert from differential to single-ended output may not consume any additional current and may be used to drive the single-ended PA stages—PA 208, 210.

Using these three stages may provide sufficient isolation to the VCO 204 leading to much lower electromagnetic pulling from the PA 208 gain step changes, so that frequency calibration may not be necessary in the beginning of each transmit burst by the transmitter 200. The lack of a frequency calibration step at the beginning of each transmit burst may save current and complexity in the MODEM design. In this implementation, the MODEM is a system element that drives the PLL 202 and supplies the signal to transmit. In this implementation, the VCO 204 frequency change in response of gain step may be small and may automatically be compensated for by the PLL 202.

Sharing the transformer 104 between the receiver 308 and the transmitter 200 may result in the primary side of the transformer 104 being coupled to the output of the PA 206 and the input of the mixer 304. This implementation may take advantage of the similar sized transistors associated with the PA 206 and the mixer 304. The PA 206 may consist of the smallest sized transistors out of all three stages—PA 206, 208, and 2010—and the transistor sizes of the PA 206 may be close in size to the transistors of the mixer 304. This equivalence in transistor size may allow the transformer 104 to resonate to almost the same capacitance value in both the transmission and receive modes of operation. In this implementation, no separate calibration or capacitor codeword change may be needed for tuning the resonator when switching between transmission and receive modes is performed. The capacitor codeword is a digital code that is programmed by the MODEM controller and is used to program the capacitors that form the LC tanks and define its resonance. The resonator in this implementation may comprise either the capacitance associated with the long traces that connect the inductor (transformer 104) to either the PA 206 or the mixer 304. Further, the VCO 204 and the transformer 104 based resonators may utilize the same type of capacitors and, hence, may allow them to track in the same direction with respect to their capacitor codewords. Allowing the two separate tanks to track in the same direction may be desirable for process and temperature tracking of all narrowband structures in the transmitter 200 and the receiver 308.

Further, sharing the transformer 104 between the PA 206 of the transmitter 200 and the mixer 304 of the receiver 308 may be beneficial due to the transmitter 200 and the receiver 308 resonating at the same frequency at this stage in both the transmitter 200 and the receiver 308. The received signal may be time varying at a different frequency after the signal leaves the mixer 304. Thus, since the transmit and received signal are at the same frequency on both sides of the transformer 104, the resonance of the two sides may be close if not the same and may contribute to the low power required to operate the transceiver 200.

The transformer 104 may also comprise a center tap 310 that may allow the transformer 104 to be independently biased in the transmit and receive modes. Biasing the transformer 104 may be in the form of a DC voltage and the DC voltage may be used to adjust a transistor biasing voltage and may differ depending on which mode the transceiver is in—transmit or receive. In one implementation, the transformer 104 may be biased using the center tap 310 to about half the supply voltage during a transmission operation so to optimally bias the PMOS and NMOS transistors of the first stage, PA 206. Further, the transformer 104 may be biased using the center tap 310 while in receive mode so to supply a bias voltage that is suitable for the common-mode voltage of a baseband amplifier. A voltage suitable for the common-mode voltage of a baseband amplifier may be a voltage that is comparable to the switching voltage of an NMOS transistor, 500 mV, for example. In this implementation, the transformer may be biased differently during the transmission operation than during the reception operation. Alternatively, the transformer 104 may either not receive a DC voltage during operation or it may receive the same voltage during transmission and during reception.

The inclusion and use of the center tap 310 to supply a biasing voltage to both the transmitter 200 and the receiver 308, allows the transceiver 300 to control the current consumption of a baseband amplifier. The supply voltage may allow for optimization of the dynamic range per unit current consumption of both the transmitter 200 and the receiver 308. Moreover, by implementing the center tap 310 to supply the various voltages, there is no additional loading with respect to the signal path in either transmit or receive modes. Additionally, neither current consumption nor dynamic range of the transceiver 300 may be penalized.

Figure 4:
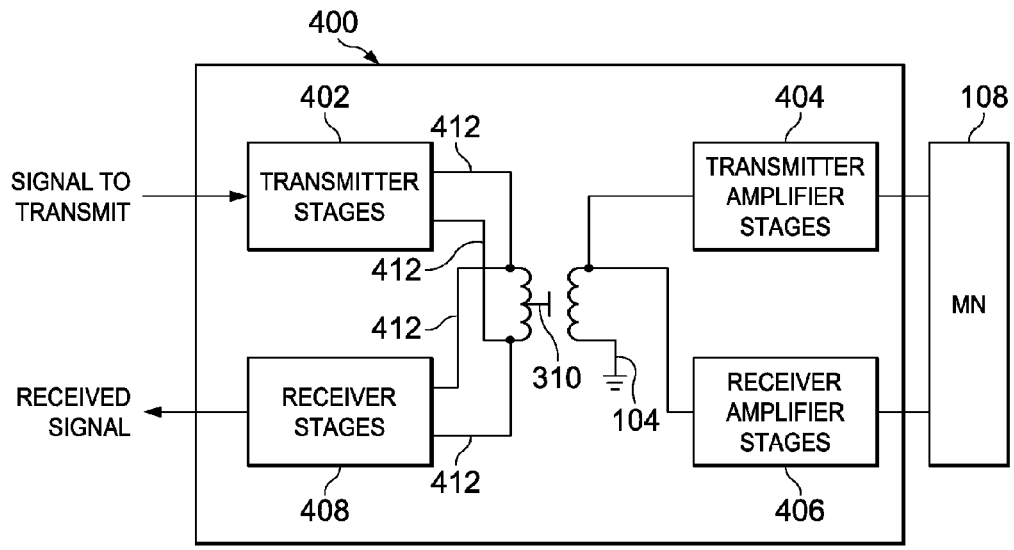
FIG. 4 shows an illustrative floor plan for a transceiver on a chip in accordance with various examples.

FIG. 4 shows an illustrative floor plan 400 for a transceiver manufactured as a system on a chip and that may be implemented by the transceiver 300 and in accordance with various examples. The floor plan 400 may comprise the transformer 104, transmitter stages 402, a transmitter amplifier stage 404, a receiver amplifier stage 406, and a receiver stage 408. The transmitter amplifier stage 404 and the receiver amplifier stage 406 may share a connection with the external network 410. The floor plan 400 shows that there may be long traces 412, e.g., 500-1000 microns in length, used to connect the various stages of the transceiver to the transformer 104. The long traces 412 extending from or to the transformer 104 (the transformer 104 may also be looked at as two inductors—a primary side inductor and a secondary side inductor that form pieces of resonator tanks or L/C circuits) may combine with the intrinsic capacitance associated with the long traces 412 to form narrowband tuning circuits. The narrowband tuning circuits have various advantages and may assist with filtering out harmonics from the VCO and distortion from the PLL. Furthermore, the narrowband tuning circuits may help decrease the power consumption of the transceiver by allowing large voltage swings at RF frequency in response to small changes in current at decreased levels of quiescent current consumption.

The implementation of the transformer 104 and the long traces 412 allows the front-end amplifiers (the receiver amplifier stage 406 and the transmitter amplifier stage 404) to be located close to one another as they may be connected to the external MN 108 via the same RF pin. Further, the long traces may also allow the synthesizer and the VCO close to one another and in a single cluster and also close to the crystal oscillator. Clustering the synthesizer, VCO and crystal oscillator may lead to the formation of long traces 412 from the signal generation cluster (e.g., PLL 202) to the signal chain transmit and receive amplification blocks. As such, the distance obtained between the VCOs, the transformer and the MN may allow for increased EM isolation between the inductive elements.

In this implementation, the transformer 104 may provide several additional advantages to the transceiver 300. Some of the advantages may stem from the use of the transformer in the transceiver 300 and some of the advantages may stem from the placement of the transformer within an interconnected chip (IC) in which the transceiver is manufactured. As discussed above, the use of the transformer 104 may filter out second and third harmonics from the RF signal along with filtering out any out-of-band noise that may be emitted by the PLL 202. The filtering of the harmonics and noise may be a result of the transformer setting up resonators with the long, highly capacitive, high Q-factor traces used to interconnect the transformer 104 to the other elements of the transceiver 300. Inductor/capacitor (L/C) circuits (also referred to herein as resonators or resonator tanks) tend to form band-pass filters. The selectivity of the L/C circuit may be determined by the inductance and the capacitance and their respective (unloaded) quality factors and may be designed by selecting appropriate values for the same. As such, the inductance of the transformer 104 and the length of the traces (the length of the traces may determine their parasitic capacitance) may be chosen to filter out the harmonics and noise for a desired RF frequency. Moreover, since the transformer 104 is a passive element, the transformer 104 may not distort the RF signal being transmitted by the transceiver 300.

Additionally, the transformer 104 may not reduce the DC headroom associated with the PA stages, thus low voltage operation may be possible, which may allow the transceiver 300 to consume less power. The transformer 104 may also reduce current consumption of the transceiver 300. A reduction in current consumption may be effectuated by the transformer 104 due to the resonating tank produces by its inclusion in the transceiver IC. The transformer 104's impedance may grow positively with frequency ($Z=jWL$, where W is the angular frequency and L denotes the inductance) until its self-resonance frequency is met, while a capacitors' (the capacitance of the long trances on the IC in this case) impedance may reduce with frequency ($Z=-1/WC$) and is opposite in nature to that of the transformer. Hence, at a certain frequency, denoted by the term "resonance frequency," these two impedances may become equal and opposite in nature. As such, the two impedances may cancel each other out leaving a "real" (resistive) impedance. This may be known as "inductors/transformers resonating out the capacitive impedance."

This resonance may be series or parallel in nature. In the case of series resonance, the input voltage is amplified by Q times while in the case of parallel resonance, the input current is amplified by Q times, where Q denotes the loaded quality factor of the inductor/capacitor combination. At resonance, the impedance of the resonator may be given by Zr=WLQ, where W is the angular frequency, L is the inductance, and Q is the loaded quality factor of the resonating tank. Voltage swings experienced by the resonator may be governed by the input current multiplied by this impedance at resonance. Hence, for a given voltage swing, lower current may be obtained if the impedance at resonance is increased.

The resonance impedance may be increased by increasing any of the three variables—W, L, and Q. For a specific radio standard, the center frequency (i.e. frequency band of operation), hence the angular frequency W, may be fixed. Thus, the impedance may be increased by increasing the product of L and Q. For most amplifier type applications operating without feedback, a high Q factor may be avoided as it can lead to significant sensitivity towards process variation. Hence, the Q is usually chosen to be <8 and the inductance is increased to maximize impedance at resonance per unit area. Thus, inductance is increased to reduce the amount of current needed to generate the same voltage swing, which decreases the overall current consumption of the transceiver 300.

Figure 5:
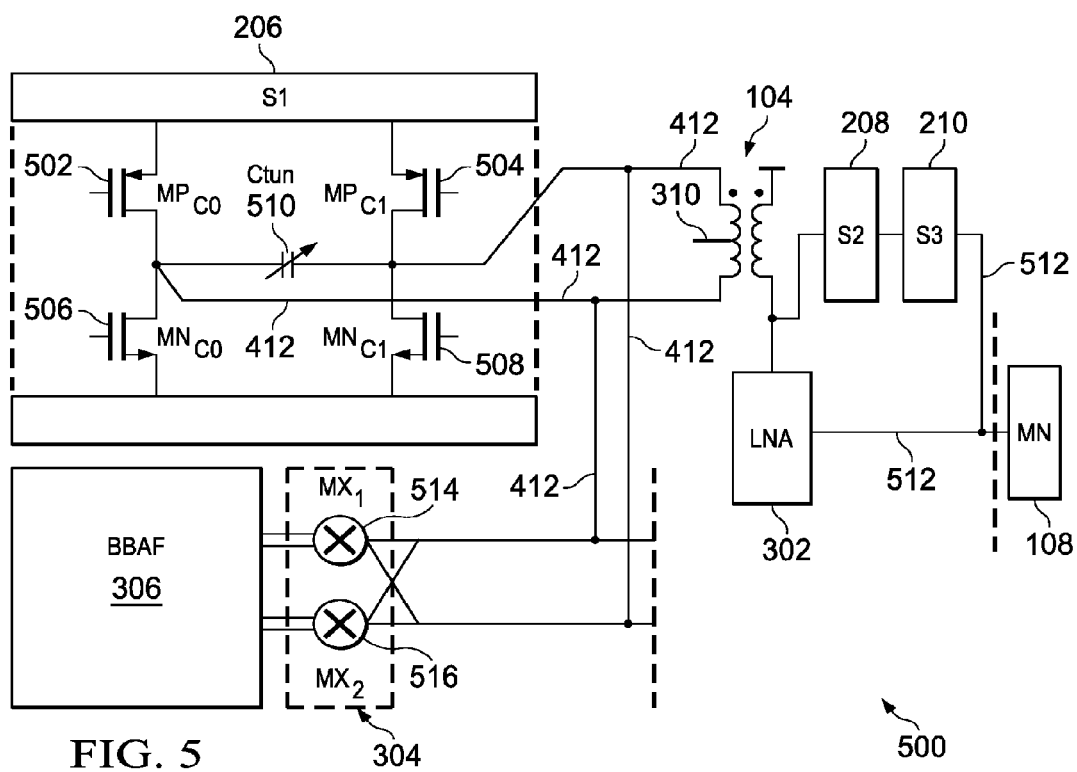
FIG. 5 shows an illustrative floor plan and transistor layout for a transceiver in accordance with various examples.

FIG. 5 shows another illustrative floor plan 500 for a transceiver in accordance with various examples. The floor plan 500 shows a transceiver, such as transceiver 300, along with some added detail for the first amplifier stage S1/PA 206. The floor plan 500 also shows that the mixer 304 comprises two mixers—a MX1 514 and a MX2 516. The two mixers, MX1 514 and MX2 516, of the mixer 304 may include four input transistors each and the input transistors may affect the input capacitance of the mixer 304. Further, the floor plan 500 shows long, high-Q traces 412 connecting the transformer 104 with the PA 206, and the four transistors $MP_{C0}$ 502, $MP_{C1}$ 504, $MN_{C0}$ 506, and $MN_{C1}$ 508. Additionally, the transformer 104 is also connected with the mixer 304 using long, high-Q traces 412. Both the stage S3 210 and the LNA 302 are connected to the external MN 108 by very short traces 512.

The PA 206 may also comprise a tuning capacitor, $C_{tun}$ 510 and the $C_{tun}$ 510 may be a metal capacitor that is tuned by a radio at radio start-up to tune the transmitter in accordance with the radio standard. The capacitance of $C_{tun}$ 510 may be much larger than the capacitance levels associated with the transistors $MP_{C0}$ 502, $MP_{C1}$ 504, $MN_{C0}$ 506, and $MN_{C1}$ 508.

To simplify the radio design and to alleviate or reduce the need to tune the resonance of the L/C tanks between transmit and receive modes, it may be beneficial to make the size of the four transistors $MP_{C0}$ 502, $MP_{C1}$ 504, $MN_{C0}$ 506, and $MN_{C1}$ 508 equal to the size of the four input transistors used in each of the MX1 514 and MX2 516 mixers. As shown in FIG. 5, both the four transistors of the PA 206 and the two mixers MX1 and MX2 are connected to the transformer 104 by long, high-Q traces 412. Thus, a narrow-band tuning circuit is created by the transformer 104 and the four transistors of the PA 206, with the capacitance associated with the four transistors and the $C_{tun}$ 510 part of the narrow-band tuning circuit and the circuit's associated resonance. The connection of the two mixers MX1 514 and MX2 516 with the transformer 104 also creates a narrow-band tuning circuit.

By making the size of the four transistors of the PA 206 nearly equal to the size of the four input transistors of the mixers MX1 514 and MX2 516, their capacitance levels may be similar, which may cause the tuning resonance of the narrow-band tuning circuits to be similar. If the tuning circuits and their resonance for the transmitter and the receiver are similar, then little to no adjustment may be required between transmit and receive modes of the transceiver 300. Thus, the design and operation of the transceiver 300 implementing the floor plan 500 may be simplified, and a faster transmit to receive turnaround time may be obtained for the transceiver 300.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A radio comprising:
   a transmitter including:
   a voltage controlled oscillator (VCO);
   a first amplifier stage coupled to the VCO and having a differential output;
   a transformer having first and second inductors, the first inductor being directly coupled to the differential output of the first amplifier stage, the transformer being configured to convert a differential output signal produced by the first amplifier stage to a single-ended signal; and
   a second amplifier stage having an input directly coupled to the second inductor of the transformer.

2. The radio of claim 1, wherein the transmitter further includes a third amplifier stage having an input coupled to an output of the second amplifier stage.

3. The radio of claim 1, further comprising:
   a receiver including:
   an amplifier; and
   a mixer,
   wherein the transformer is coupled between the amplifier of the receiver and the mixer of the receiver.

4. The radio of claim 3, wherein the transformer includes a center tap, and wherein a different voltage is applied to the center tap of the transformer during transmission than during reception.

5. The radio of claim 1, wherein the transmitter is constructed on a single integrated circuit.

6. The radio of claim 1, wherein the input of the second amplifier stage is a single-ended input.

7. A device comprising:
   a transmitter including:
   a first amplifier stage having a differential output;
   a second amplifier stage having an input; and
   a transformer coupled to the differential output of the first amplifier stage and to the input of the second amplifier stage,
   wherein the transformer includes a first inductor directly coupled to the differential output of the first amplifier stage, and a second inductor directly coupled to the input of the second amplifier stage.

8. The device of claim 7, wherein the transmitter further includes a third amplifier stage having an input coupled to an output of the second amplifier stage.

9. The device of claim 7, further comprising:
   a receiver including:
   an amplifier; and
   a mixer,
   wherein the transformer is coupled between the amplifier of the receiver and the mixer of the receiver.

10. The device of claim 9, wherein the transformer includes a center tap, and wherein a different voltage is applied to the center tap of the transformer during transmission than during reception.

11. The device of claim 7, wherein the transmitter is constructed on a single integrated circuit.

12. The device of claim 7, wherein the input of the second amplifier stage is a single-ended input.

13. An integrated circuit comprising:
a transmitter including:
a first amplifier stage having a differential output;
a second amplifier stage having an input; and
a transformer coupled to the differential output of the first amplifier stage and to the input of the second amplifier stage,
wherein the transformer includes a first inductor directly coupled to the differential output of the first amplifier stage, and a second inductor directly coupled to the input of the second amplifier stage.

14. The integrated circuit of claim 13, wherein the transmitter further includes a third amplifier stage having an input coupled to an output of the second amplifier stage.

15. The integrated circuit of claim 13, further comprising:
a receiver including:
an amplifier; and
a mixer,
wherein the transformer is coupled between the amplifier of the receiver and the mixer of the receiver.

16. The integrated circuit of claim 15, wherein the transformer includes a center tap, and wherein a different voltage is applied to the center tap of the transformer during transmission than during reception.

17. The integrated circuit of claim 13, wherein the input of the second amplifier stage is a single-ended input.

* * * * *